United States Patent [19]

de Miranda et al.

[11] 4,195,195
[45] Mar. 25, 1980

[54] TAPE AUTOMATED BONDING TEST BOARD

[75] Inventors: William R. R. de Miranda, Clearwater, Fla.; Edwin R. Smith, Jamestown, N.C.

[73] Assignee: The United States of America as represented by the Secretary of the Army, Washington, D.C.

[21] Appl. No.: 946,490

[22] Filed: Sep. 28, 1978

[51] Int. Cl.² ............................................. H05K 1/02
[52] U.S. Cl. ................................. 174/68.5; 361/406; 361/408; 361/409
[58] Field of Search .......................... 174/68.5, 52 FP; 339/17 CF; 361/403, 406, 409, 408

[56] References Cited

U.S. PATENT DOCUMENTS

| | | | |
|---|---|---|---|
| 3,390,308 | 6/1968 | Marley | 174/68.5 |
| 3,496,419 | 2/1970 | Sakellakis | 174/68.5 X |
| 3,716,761 | 2/1973 | Rotast | 361/409 |
| 3,951,495 | 4/1976 | Donaher | 339/17 CF |
| 4,007,479 | 2/1977 | Kowalski | 174/52 FP |
| 4,012,117 | 3/1977 | Lazzery | 361/408 X |
| 4,109,096 | 8/1978 | Dahiine | 174/68.5 |

OTHER PUBLICATIONS

Oswald et al., Advances in TAB For Hydrids-TC Outer Lead Bonding, Distributed at the 1977 International Microelectronics Symposium, Oct. 1977.

*Primary Examiner*—Richard R. Kucia
*Attorney, Agent, or Firm*—Nathan Edelberg; Sheldon Kanars; Bernard Franz

[57] ABSTRACT

There is disclosed a universal electrical conductor pattern for both multilayer and single layer test substrates for tape bonded hybrids which is adapted to accept semiconductor chips of various sizes and numbers of leads. The pattern consists of four sets of equally spaced parallel rectangularly shaped outer lead bonding pads which are orthogonally arranged in a repetitive sequence around a chip bonding pad. Each set of outer lead bonding pads consists of a first subset of six like pads arranged adjacently in registration along one edge of the chip bonding pad, and second and third subsets of two outer lead bonding pads each arranged on either side of said first subset in parallel relationship therewith but set back from the corners of the chip bonding pad. The rectangularly shaped outer lead bonding pads extend away from the respective edges of the chip bonding pad a predetermined distance so as to accommodate either twenty four, thirty two or forty pin lead frames having a standard twenty mil lead spacing.

12 Claims, 13 Drawing Figures

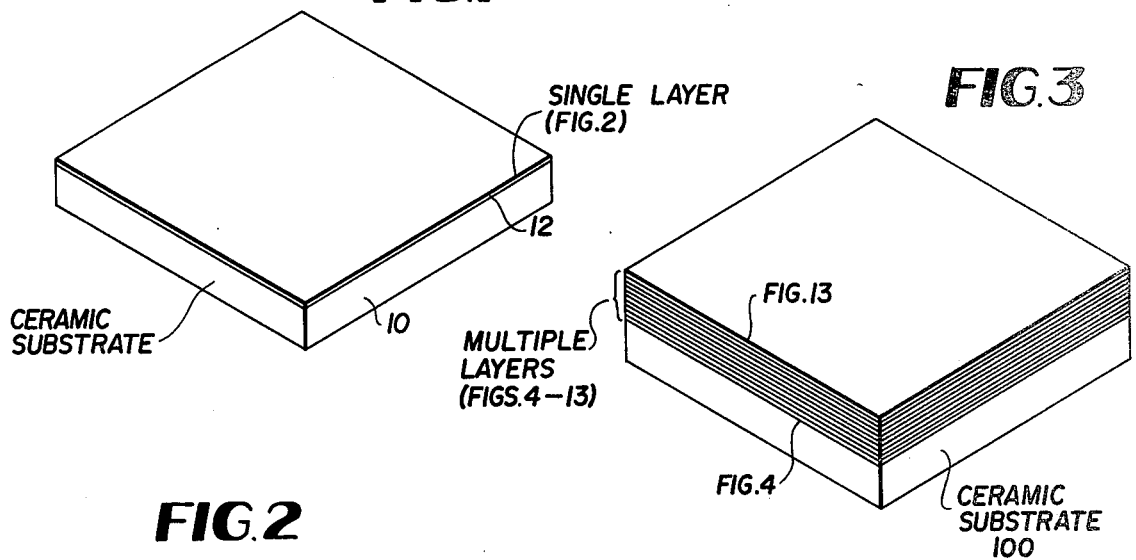
FIG.1
FIG.3
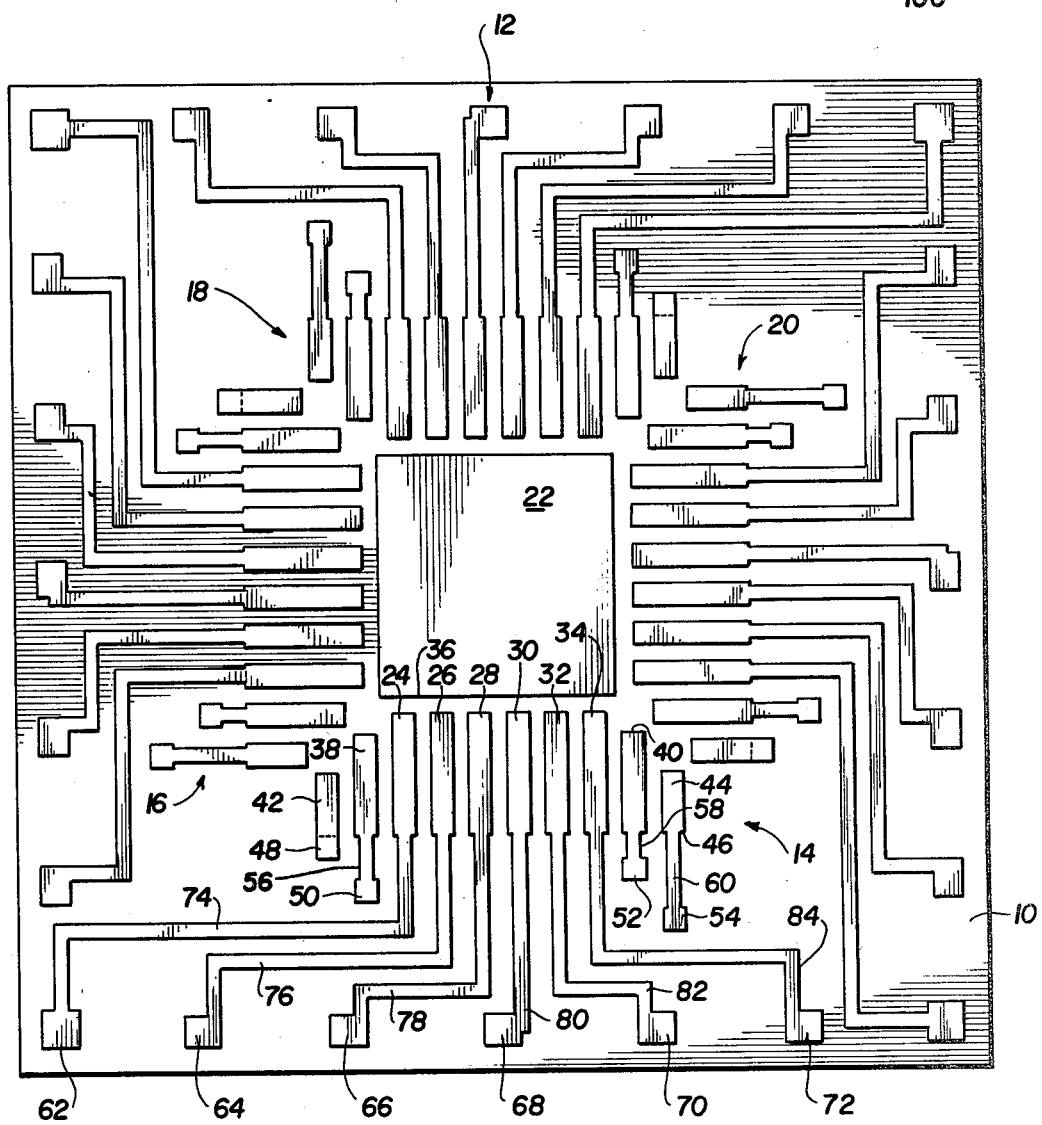
FIG.2

TAPE AUTOMATED BONDING TEST BOARD

The invention described herein may be manufactured and used by or for the Government for governmental purposes without the payment of any royalties thereon or therefor.

BACKGROUND OF THE INVENTION

This invention relates generally to means for connecting tape bonded semiconductor chips to external electrical conductor leads and more particularly to a universal electrical conductor pattern formed on a dielectric sheet or substrate which is adapted to accept chips of various sizes and with varying numbers of leads.

The development of integrated circuit chips, particularly medium and large scale integrated circuit chips, has created a need for improved manufacturing processes which lend themselves to automating the connecting of conductive flexible leads of lead frame to an integrated circuit (IC) chip and of such chips and part of their lead frame to substrates or into packages to connect the chips into electrical circuits known as hybrid microcircuits. It is known to use a relatively long tape like carrier, similar to standard motion picture film, to which is bonded a thin metallic layer of a suitable electrical conductor such as copper, nickel or aluminum. The metallic layer can be formed into a lead frame of a desired configuration by a conventional photo etching process. Subsequently, IC chips are bonded to the lead frames. The prior art also teaches excising a chip and a portion of its lead frame directly from a substantially continuous strip of such tape or film. For a detailed consideration of such technology, reference is made to an article by the present inventor entitled, "Automated Tape Carrier Bonding For Hybrids" which appeared in the March, 1978 issue of *Solid State Technology*, at pp. 39–48.

SUMMARY OF THE INVENTION

Briefly, the subject invention is directed to a universal electrical integrated circuit conductor pattern fabricated on a dielectric sheet or substrate for electrically contracting, typically for test purposes, integrated circuit (IC) chips of different sizes and with different numbers of leads. The pattern is formed on a ceramic substrate and consists of a square shaped chip bonding pad around which is located four sets of regularly spaced elongated outer conductor bonding pads arranged in a repetitive sequence around the chip bonding pad. The outer conductor bonding pads are rectangular in shape and extend away from the periphery or edges of the bonding pad. Each set of outer lead bonding pads consists of a first subset of six outer lead bonding pads having their forward edges respectively aligned adjacent an edge of the chip bonding pad, a second subset of two outer lead bonding pads, one on each side of the first subset having their forward edges spaced a predetermined distance back from the forward edge of the first subset at the corner region of said chip bonding pad, and a third subset of two outer lead bonding pads, one on either side of said second subset and having their forward edges spaced back from the forward edges of the second subset. The rearward edge of the outer lead bonding pads extend away from the chip bonding pad and equal distance so as to accommodate for example 24 lead, 32 lead and 40 lead tape bonded chip assemblies equally well. All of the outer lead bonding pads are thus maximized in number while maintaining a standard spacing between adjacent pads.

BRIEF DESCRIPTION OF THE DRAWINGS

FIG. 1 is a perspective view of a single metallization layer embodiment of the subject invention fabricated on a substrate;

FIG. 2 is a plan view of the universal conductor pattern of the metallization formed on the substrate shown in FIG. 1;

FIG. 3 is a perspective view of a multilayer metallization embodiment of the subject invention formed on a ceramic substrate.

DESCRIPTION OF THE PREFERRED EMBODIMENTS

Figure 4:
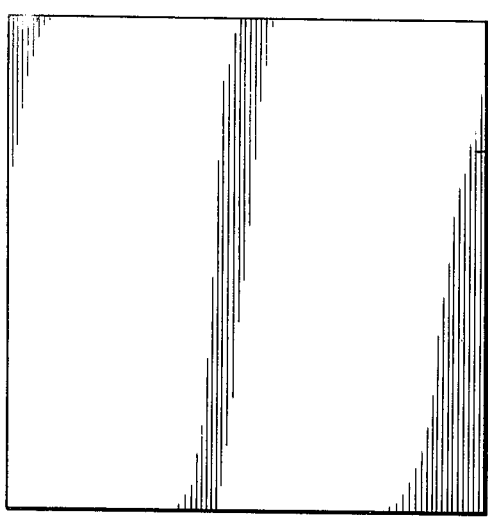
FIGS. 4 through 13 are plan views of the multiple layers of metallization and dielectric making up the multilayered embodiment shown in FIG. 3.
Figure 5:
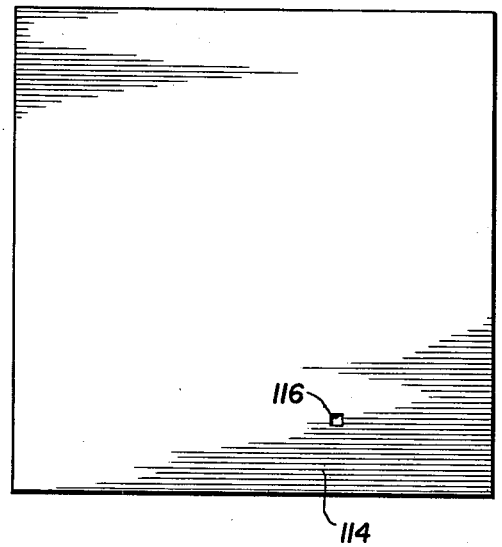

Tape automated bonding (TAB) technology makes use of an etched copper foil laminated to a flexible non-conducting film. This tape acts as a carrier vehicle for semiconductor integrated circuit chips. After bonding the chips to the conducting foil portion called the lead frame, the chip and a section of the lead are cut from the film and 37 outer lead bonded" to a stamped metal frame or in the case of hybrids, to a metallized ceramic substrate. It is to the latter type of device that the present invention is directed and to this end reference is first made to FIG. 1 wherein reference numeral 10 refers to a ceramic substrate having a flat face upon which is formed a single layered outer lead bond conductor pattern 12 of gold, for example, which is configured to accept an electrical contact semiconductor chip of different sizes and numbers of leads and being particularly adapted to operate as a test and burn-in bed for an integrated circuit chip, not shown.

The conductor pattern 12 is shown in plan view in FIG. 2 and is operable to accept standard 24, 32 and 40 pin lead frame assemblies. As shown in FIG. 2, the conductor pattern consists of four identically repetitive sets 14, 16, 18 and 20 of outer lead bonding pads, interconnects, vias and wire bonding pads orthogonally arranged around respective edges of a square shaped chip metallized bonding pad 22. Inasmuch as the four set conductor pattern is identical, only one set, for example, the conductor pattern set 14 will be described. The outer lead bonding pads of the conductor set 14 consist of three subsets of elongated rectangularly shaped metallization areas comprised of: six interior metallization areas 24, 26, 28, 30, 32 and 34 which are located side by side immediately adjacent the edge 36 of the chip bonding pad 22, two like intermediate metallization areas 38 and 40 on either side of the first subset of metallization areas 24 . . . 34 and lastly, two outermost metallization areas 42 and 44 on either side of the metallizations 38 and 40.

It is to be noted that all of the aforesaid outer lead bonding pad metallization areas are equally spaced, being located typically 0.020 inches on centers on a 0.5×0.5 inch substrate. It is also significant that the three sets of outer lead bonding pads consist of enlarged rectangular areas which extend outwardly from the chip bonding pad a relatively significant distance. For example, where a 0.5×0.5 inch square substrate 10 is utilized and a 0.122×0.122 inch bonding pad is formed on the substrate, the outer lead bonding pad metallization areas extend typically 0.069 inches away from the edge of the chip bonding pad with the chip bonding pads themselves being typically 0.012 inches in width. It can be seen that the forward or inward facing edges of the six outer lead bonding pads 24, 26, . . . 34 forming the first subset are linearly aligned with one another and parallel to the edge 36 of the chip bonding pad 22. The second subset of outer lead bonding pads 38 and 40 have their respective forward edges set back from the common forward edge of the first subset by substantially the same distance as the first subset is separated from the edge 36. The third subset of outer lead bonding pads 42 and 44 have their respective forward edges set back relative to the forward edges of the second subset 38 and 40 by an amount substantially equal to the distance the second subset is away from the edge 36. Thus the configuration is such that the second and third subsets of outer lead bonding pads have their forward edges receding along the diagonal axes of the chip bonding pad 22.

Note is also made of the face that the rear edge 46 of one outermost bonding pad 44 is aligned with the rear edges of the other outer lead bonding pads. Bonding pad 42, however, also includes a square shaped metallization appendage 48. The metallization 48 is adapted to comprise a via which has utility in connection with a multilayered embodiment to be considered in connection with FIG. 3. Like square metallization areas 50, 52 and 54 also adapted to embody vias are also coupled to the outer lead bonding pads 38, 40 and 44 by means of respective leads called interconnects 56, 58 and 60. With respect to the first subset of outer lead bonding pads 24 through 34, they couple to respective wire bonding pads 62, 64, 66, 68, 70 and 72 by means of respective interconnects 74, 76, 78, 80, 82 and 84 in a fan-out arrangement so that all of the wire bonding pads are equally spaced around the periphery of the substrate 10.

Figure 6:
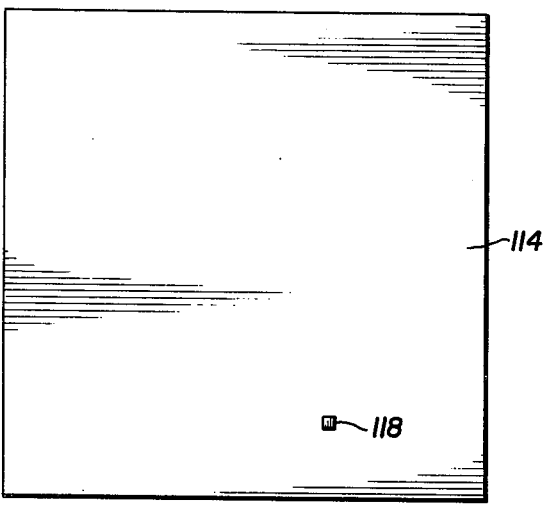
Figure 7:
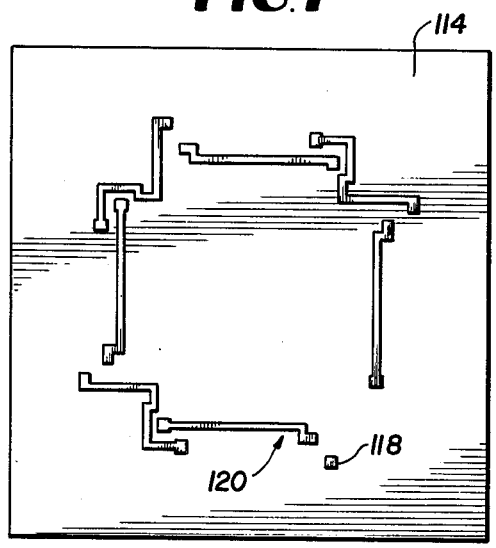
Figure 8:
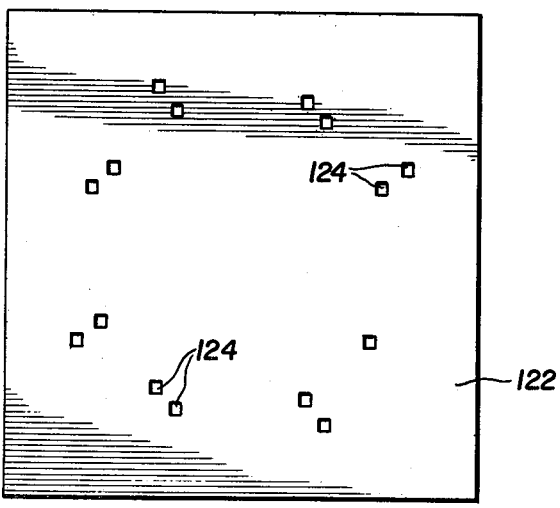
Figure 9:
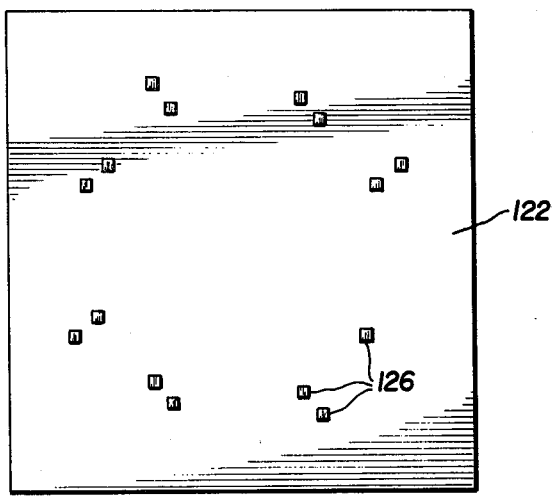
Figure 10:
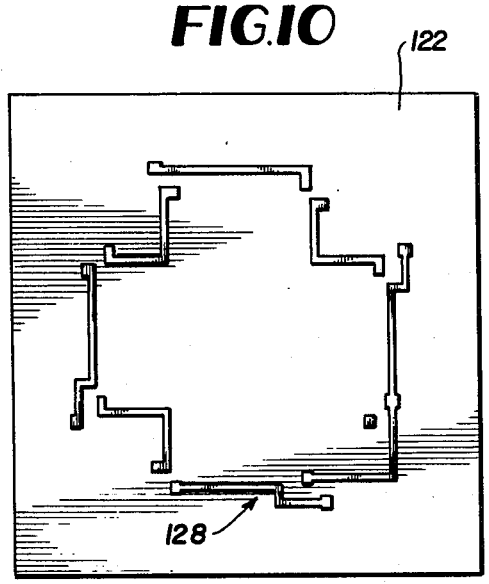
Figure 11:
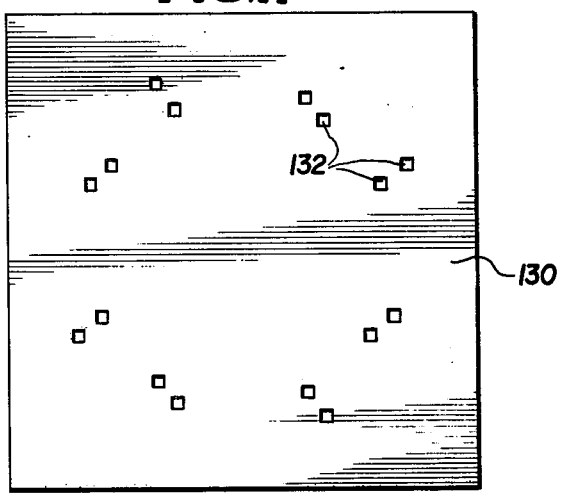
Figure 12:
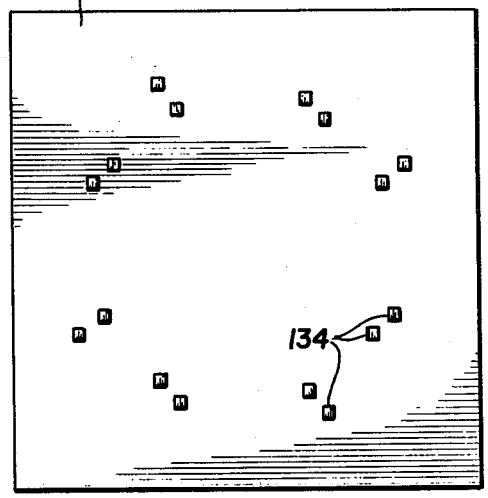
Figure 13:
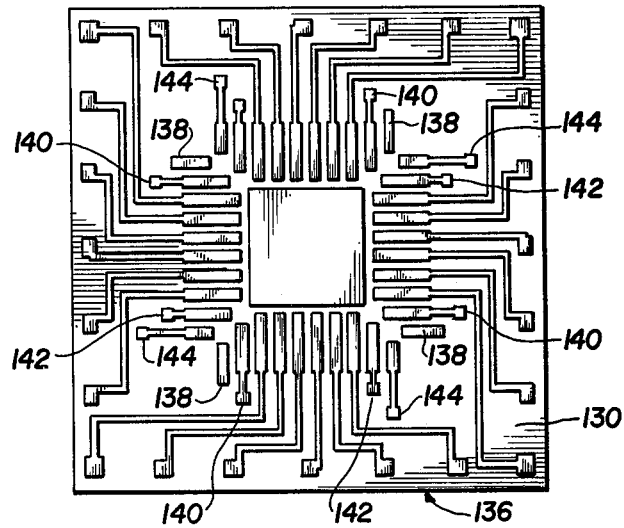

The conductor pattern thus formed on the substrate 10 utilizes the four sets of six outer lead bonding pads 24, 26 . . . 34 forming the first subset to accommodate the electrical connection thereto of a 24 or less lead integrated circuit chip, not shown, which would be secured to the chip bonding pad 22. A 32 or less lead chip on the other hand would utilize not only the first subset of outer lead bonding pads 24 . . . 34, but also the second subset of pads 38 and 40. In a like manner, the 40 or less lead chip would utilize all four sets of ten outer lead bonding pads which make up the three subsets of bonding pads 24-44. Thus the metallization pattern shown in FIG. 2 has the advantage that multiple chip sizes and multiple outer lead bond sizes can be connected to a common test substrate without Considering now a multi-layered embodiment of the subject invention, the use of underlying layers of metallization formed in a predetermined pattern separated by a dielectric layer or film and with electrical connections between the various layers being made by the use of vias, i.e. inter level interconnections, a predetermined interconnection between the four sets 14, 16, 18 and 20 of outer lead bonding pads 24 . . . 44 illustrated in FIG. 2 can be obtained. To this end, reference is now made to FIG. 3 wherein there is shown a ceramic substrate 100 upon which there is formed multiple layers of metallization and dielectric as shown in FIGS. 4 through 13, FIG. 13 exhibiting the same conductor pattern as shown in FIG. 2. Considering now the various layers of the embodiment shown in FIG. 3, FIG. 4 constitutes a first layer of metallization 112 which substantially covers the entire surface of the substrate 100 and acts as a ground conductor. Next an overlay of a first thin film or layer 114 of dielectric material is formed over the ground metallization 74 and includes one small square shaped via hole 116 as shown. Next one square of metallization 118 shown in FIG. 6 is formed at the location of the via hole 116 shown in FIG. 5. Next referring to FIG. 7, a second layer of metallization 120 in the pattern shown is formed followed by a second layer 122 of dielectric material as shown in FIG. 8 having 15 selectively spaced square via holes 124. The 15 via holes 124 in the dielectric layer shown in FIG. 8 is filled in by the via metallization pattern 126 shown in FIG. 9. A third layer of metallization 128 in the pattern shown in FIG. 10 is next formed on the second dielectric layer 122 shown in FIG. 8. Over the metallization pattern 128 shown in FIG. 10 is a third thin film or layer 130 of dielectric material as shown in FIG. 11 which includes in addition to the 15 via holes of FIG. 8, an additional via hole 132 making the number equal to 16. As in the other sublayers, the via holes in the dielectric layer shown in FIG. 11 is filled in by means of the via metallization pattern 134 shown in FIG. 12. Finally, a fourth metallization pattern 136 identical to the pattern 12 shown in FIG. 2 is formed on the third dielectric layer 130 (FIG. 11) as shown in FIG. 13. It can be seen that the overlapping via hole patterns of FIGS. 5 through 12 are in registration with the via registration areas 138, 140, 142 and 144 of FIG. 13 and correspond to the areas 48 to 50, 52 and 54 of FIG. 2.

What has been shown and described, therefore, is a universal outer lead bond conductor pattern fabricated either in a single layer or multi-layer configuration on a ceramic substrate for electrically contacting various sizes and lead numbers of integrated circuit chips without the necessity of personalized or specially designed outer lead bond patterns.

Having thus disclosed what is at present considered to be the preferred embodiments of the subject invention, it should be observed that the foregoing detailed description is made by way of illustration and is not meant to be interpreted in a limiting sense, since, when desirable, other modifications and changes may be resorted to without departing from the spirit and scope of the present invention as defined in the appended claims.

We claim as our invention:

1. A universal electrical conductor pattern fabricated on a dielectric substrate for electrically contacting semiconductor chip assemblies of different sizes and numbers of leads, comprising in combination:
   four sets of regularly spaced outer conductor bonding pads orthogonally located around the periphery of a central area on one face of said dielectric substrate, said bonding pads being rectangular in shape and extending outwardly from the periphery of said central area;
   each set of said four sets of bonding pads respectively consisting of,
   (a) a first subset of bonding pads having line rectangular dimensions located side by side in parallel relationship and having their forward and rearward edges in registration with one another, said forward edges defining said periphery of said central area;
   (b) a second subset comprised of at least two outer lead bonding pads, one located on each side of said first subset and being arranged in parallel therewith and having respective forward edges spaced at predetermined distance back from the forward edges of said first subset of bonding pads and having respective rear edges in registration with the rear edges of said first subset; and (c) a third subset of at least two outer lead bonding pads, one on each side of said second subset in parallel relationship therewith and having forward edges spaced back from the forward edges of said second subset and at least one bonding pad of said third subset having a rearward edge in registration with the rear edges of said first and second subset; and respective electrical conductor means in the form of interconnects and vias joined to the rear edges of said four sets of outer lead bonding pads.

2. The electrical conductor pattern as defined by claim 1 wherein said central area defines a square central area and additionally including a chip bonding pad of predetermined shape located within said central area.

3. The electrical conductor pattern as defined by claim 2 wherein said predetermined shape of said chip bonding area comprises a square shaped pad having edges which are in parallel relationship with the forward edges of said four sets of outer lead bonding pads.

4. The conductor pattern as defined by claim 3 wherein each first subset of the outer lead bonding pads are located within the boundary of the respective adjacent edge of said chip bonding pad.

5. The conductor pattern as defined by claim 4 wherein each said second and third subsets of outer lead bonding pads are located outside the boundary of the respective adjacent edge of said chip bonding pad.

6. The conductor pattern as defined by claim 4 wherein each said second and third subset of outer lead bonding pads are located at the corners of said chip bonding pad.

7. The conductor pattern as defined by claim 4 wherein said second subset of outer lead bonding pads have their forward edges spaced away from the forward edges of said first subset of outer lead bonding pads by a predetermined distance and wherein said forward edges of said third set of outer lead bonding pads is spaced back from the forward edges of said second subset of outer lead bonding pads by a predetermined distance, to provide an equal incremental spacing of the forward edges of said second and third subset away from the leading or forward edges of said first subset.

8. The conductor pattern as defined by claim 1 wherein said first set of outer lead bonding pads is at least six in number thereby providing a chip outer lead bonding pad arrangement for a twenty four or less lead chip assembly, said second subset being operable in combination with said first subset for providing a chip outer lead bonding pad arrangement for a thirty two or less lead chip assembly, and said third subset being operable in combination with said first and second subsets, providing a chip outer lead bonding pad arrangement for a forty or less lead chip assembly.

9. The conductor pattern as defined by claim 1 and additionally including wire bonding pad areas at the extremities of selected ones of said electrical conductor means.

10. The conductor pattern as defined by claim 1 and additionally including wire bonding pads connected by means of said electrical conductor means to the rear edges of said first subset of outer lead bonding pads.

11. The conductor pattern as defined by claim 10 wherein said wire bonding pads are located adjacent the periphery of said dielectric substrate.

12. The universal conductor pattern as defined by claim 11 wherein said wire bonding pads are equally spaced from one another around the periphery of said dielectric substrate.

* * * * *